United States Patent

Moore

Patent Number: 5,972,511
Date of Patent: Oct. 26, 1999

[54] PROCESS FOR FORMING LOW THERMAL EXPANSION PYROLYTIC NITRIDE COATINGS ON LOW THERMAL EXPANSION MATERIALS AND COATED ARTICLE

[75] Inventor: Arthur William Moore, Strongsville, Ohio

[73] Assignee: Advanced Ceramics Corporation, Lakewood, Ohio

[21] Appl. No.: 08/630,041

[22] Filed: Apr. 2, 1996

Related U.S. Application Data

[63] Continuation-in-part of application No. 08/332,693, Nov. 1, 1994, abandoned.

[51] Int. Cl.$^6$ .................. B32B 9/00; B32B 7/02; C23C 16/00; C04B 35/58
[52] U.S. Cl. .............. 428/408; 427/255.2; 428/212; 428/688; 428/689; 428/698; 428/699; 428/704; 501/96; 501/97
[58] Field of Search .................. 427/255.2; 428/212, 428/408, 688, 689, 698, 699, 704; 501/96, 97

[56] References Cited

U.S. PATENT DOCUMENTS 4,772,304  9/1988  Nakae et al. ........................ 65/18.2
5,128,286  7/1992  Funayama et al. ................. 501/97

OTHER PUBLICATIONS

Diamond & Related Materials "Preparation of Si–N–B Films by CVD Techniques". . . (1996) 580–583.

*Primary Examiner*—Jeffrey Stucker
*Assistant Examiner*—Hankyel T. Park
*Attorney, Agent, or Firm*—Eugene Lieberstein

[57] ABSTRACT

A coated article of a stoichiometric coating composition of pyrolytic PB(Si)N on low thermal expansion carbon, graphite or ceramic materials and process of forming the coated article. The process involves introducing reactant vapors, under appropriate deposition conditions, within a heated furnace chamber containing the article to be coated. The reactant vapors are composed of ammonia, a gaseous source of boron and silicon and a diluent gas and are fed at a gas flow rate such that the combined flow rate of boron and silicon is less than the flow rate of ammonia.

4 Claims, 3 Drawing Sheets

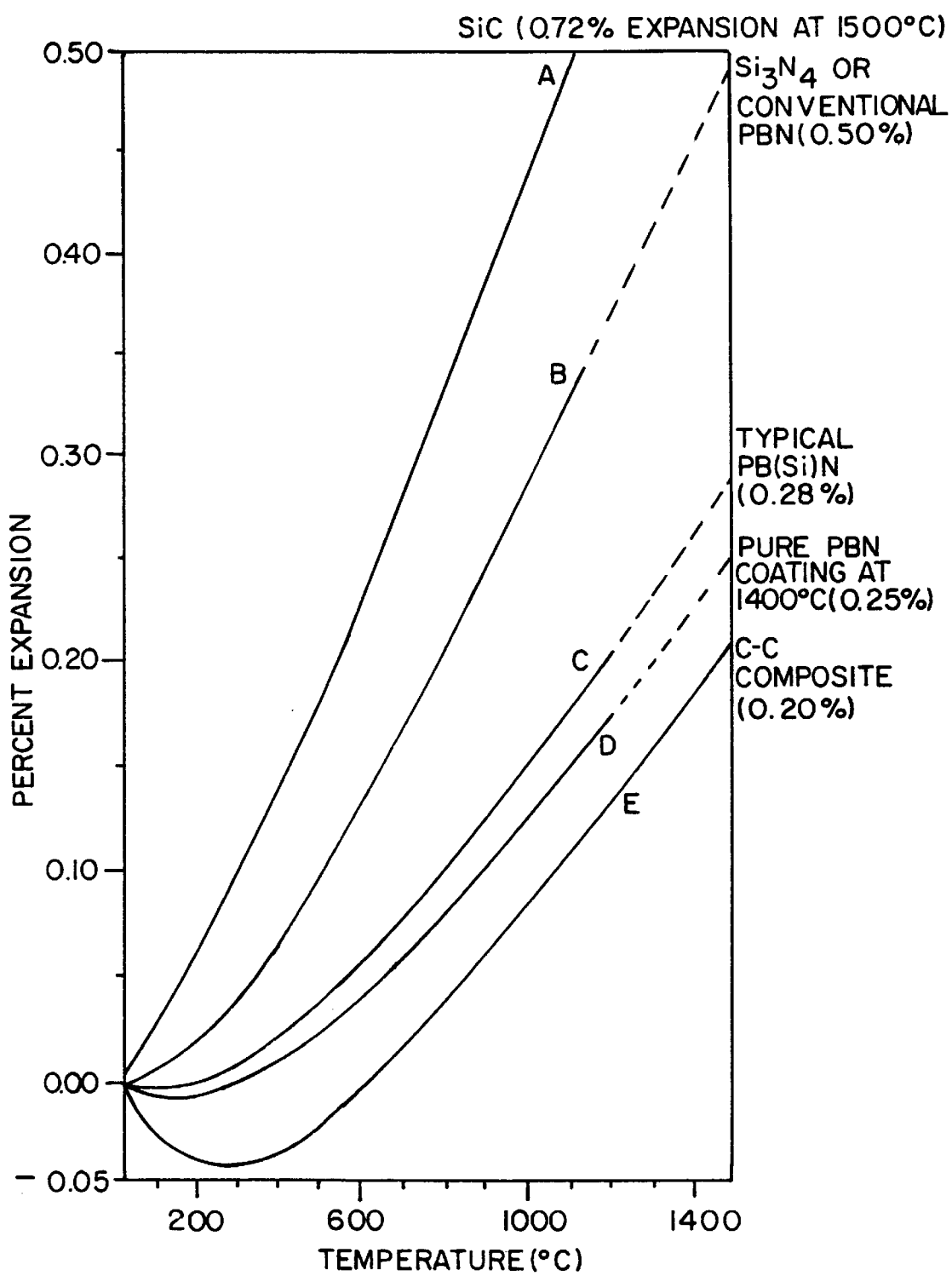

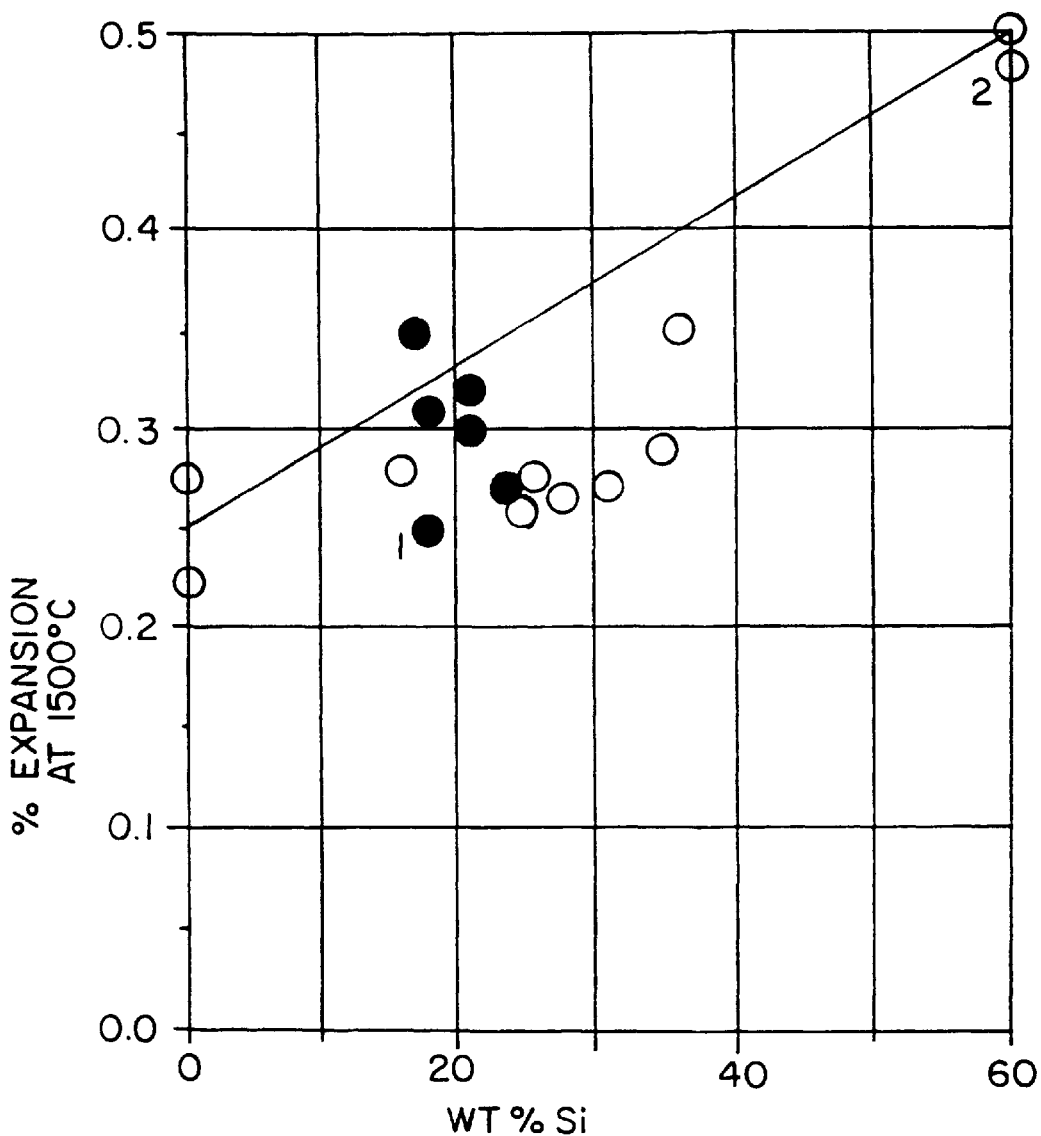

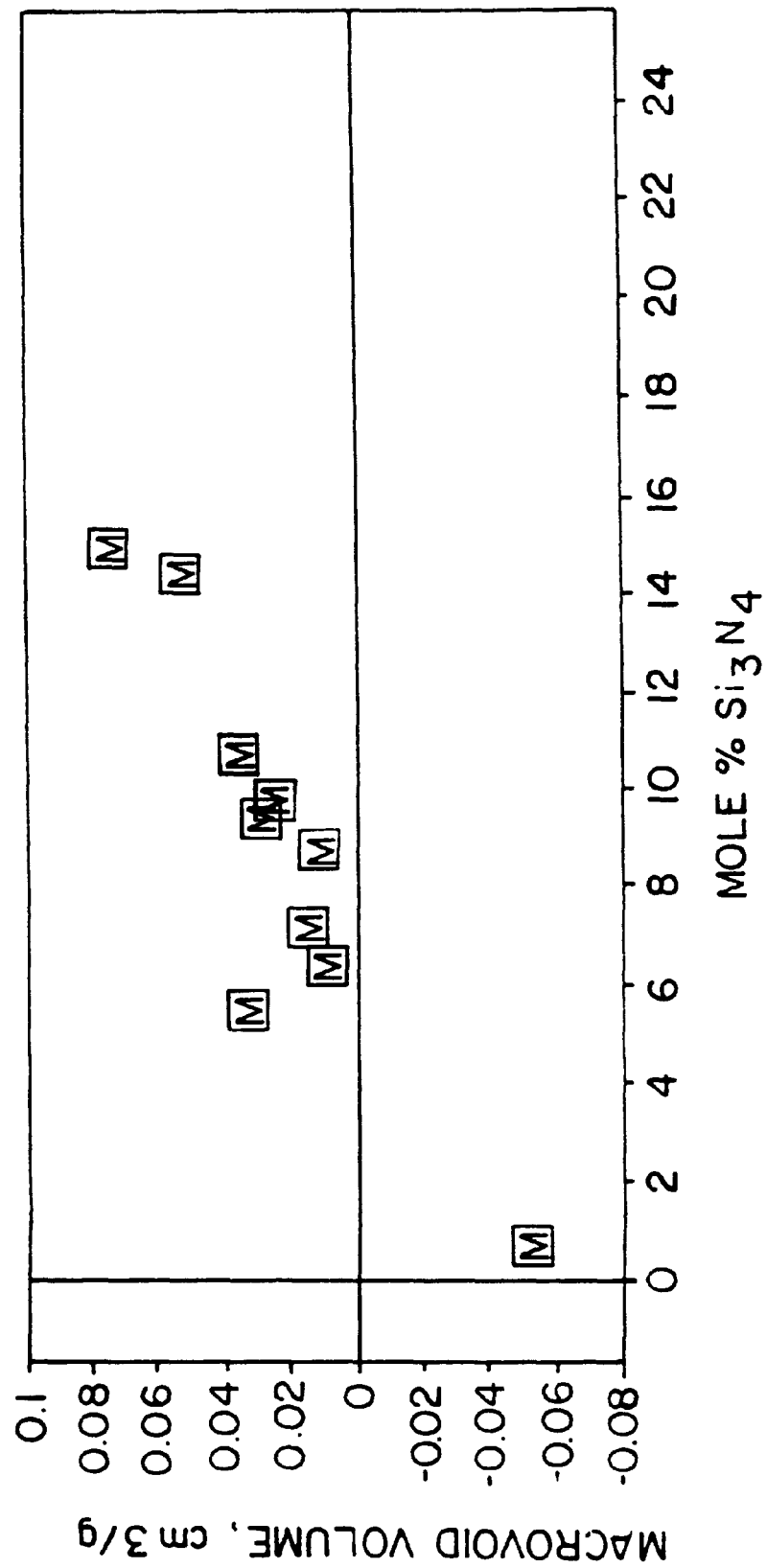

PROCESS FOR FORMING LOW THERMAL EXPANSION PYROLYTIC NITRIDE COATINGS ON LOW THERMAL EXPANSION MATERIALS AND COATED ARTICLE

The present invention is a continuation-in-part of U.S. patent application Ser. No. 332,693 filed Nov. 1, 1994, and relates to an improved process for forming a stoichiometric coating composition of pyrolytic (boron and silicon) nitride, hereinafter referred to as PB(Si)N, on low thermal expansion carbon, graphite or ceramic materials to provide such materials with oxidation protection at high temperature extending to 1500° C. and to the article formed by such process.

BACKGROUND OF INVENTION

Low thermal expansion material such as carbon-carbon composites are important materials for aerospace applications because of their high strength and toughness at high temperature. However, their use in air is limited because of oxidation. A ceramic coating should be able to provide the required oxidation protection, but because of the very low thermal expansion coefficient of high modulus carbon-carbon composites, it is difficult to find a ceramic coating with matching thermal expansion. U.S. Pat. No. 5,275,844 dated Jan. 4, 1994, the disclosure of which is herein incorporated by reference, teaches that a pyrolytic boron nitride coating can, under the correct coating conditions, produce an adherent "crack-free" coating, on low thermal expansion material, which is resistant to oxidation up to about 800° C. for an extended time period of over 20 hours and at even higher temperatures for shorter time periods. A "crack-free" coating is defined in U.S. Pat. No. 5,275,844 as being essentially free of cross-plane cracks which would otherwise allow air to penetrate to the underlying carbon-carbon composite or other low thermal expansion material. Using the process described in the aforementioned patent, a pyrolytic boron nitride coating may be formed on a carbon-carbon composite structure having a thermal expansion between 0.14 to 0.32 percent over a temperature range between room temperature and 1500° C., which will closely conform to the thermal expansion of a typical carbon-carbon composite. However, a conventional pyrolytic boron nitride coating will not sustain a temperature environment exceeding 1000° C.

Alternate ceramic materials such as silicon carbide have been extensively studied, but its thermal expansion to 1500° C. is more than three times that of a carbon-carbon composite so that cracks form in the coating on cooling from deposition temperature. Because these coatings crack, the carbon-carbon composite may instead be treated with low-melting oxidation inhibitors which flow and fill the crack. This is not a desirable solution to the problem. The same problem exists for silicon nitride, which has more than twice the expansion of a carbon-carbon composite to 1500° C.

SUMMARY OF THE INVENTION

It has been discovered in accordance with the present invention that under appropriate deposition conditions, a well-bonded coating of pyrolytic (boron and silicon) nitride, having the composition $BSi_xN_{1+1.33x}$, hereinafter referred to as PB(Si)N, may be formed on a low thermal expansion carbon or graphite material such as a carbon-carbon composite which will remain crack-free at temperatures of up to 1500° C. for time periods exceeding 20 hours. The thermal expansion mismatch between the PB(Si)N coating of the present invention and a carbon-carbon composite may be kept below 0.1% from room temperature up to 1500° C., with the coating containing up to 25% silicon and possessing up to from ten to one hundred times the oxidation resistance of pure pyrolytic boron nitride "PBN" in air at 1000° C. to 1500° C.

The process of the present invention for forming a well-bonded crack free coating of PB(Si)N on low thermal expansion carbon or graphite material comprises the steps of: placing the carbon or graphite material within a furnace chamber of a reactor vessel; heating the atmosphere in the furnace chamber to a uniform temperature of between 1350° C. to 1550° C., reducing the chamber pressure to less than 1.5 Torr; introducing reactant vapors into said furnace chamber consisting essentially of ammonia, a gaseous source of boron and of silicon and a diluent selected from the class of nitrogen, hydrogen and a stoichiometric excess of ammonia, adjusting the flow rate of ammonia to the flow rate of said source of boron and silicon such that the combined flow rate of boron and silicon is less than the flow rate of ammonia whereby a coating of PB(Si)N is formed on said low expansion material having a thermal expansion mismatch to 1500° C. of less than about 0.1 percent.

The coated article of the present invention comprises a substrate of low thermal expansion carbon or graphite having a coating of PB(Si)N containing from 2 wt % to 35 wt % silicon having a thermal expansion mismatch to 1500° C. of less than about 0.1% formed by the process of introducing reactant vapors into a heated furnace chamber at a uniform deposition temperature of between 1350° C. to 1550° C. and at a chamber pressure of less than 1.5 Torr with said reactant vapors consisting essentially of ammonia, a gaseous source of boron and silicon and a diluent selected from nitrogen and/or hydrogen, and controlling the flow rate of the gases such that the combined flow rates of boron and silicon is less than the flow rate of ammonia.

BRIEF DESCRIPTION OF THE DRAWINGS

The advantages of the present invention will become apparent from the following detailed description of the present invention when read in conjunction with the accompanying drawings of which:

FIG. 1 is a graph comparing the thermal expansion curve of a carbon-carbon composite with selected coating compositions;

FIG. 2 shows the thermal expansion at 1500° C. versus silicon content in PB(Si)N coatings; and FIG. 3 is a graph showing the relationship between macrovoid volume and mole percent $Si_3N_4$ for the coating of the present invention.

DETAILED DESCRIPTION OF THE INVENTION

Coatings of the present invention are deposited by conventional chemical vapor deposition techniques, in which gas sources and deposition conditions for boron nitride and separately for silicon nitride are well known in the art. In general pyrolytic boron nitride is formed on a free standing structure by the thermal decomposition of boron trichloride and ammonia vapors at a reaction temperature of between 1450° C. and 2300°. U.S. Pat. No. 5,275,844 teaches that a uniformly heated furnace with the deposition temperature controlled to lie between 1500° C. and 1700° C. is essential to achieve a low thermal expansion in close conformity to the thermal expansion of the carbon-carbon composition. It was discovered in accordance with the present invention that pyrolytic boron nitride may be codeposited with silicon to achieve a low thermal expansion in close conformity to the thermal expansion of carbon or graphite material under controlled conditions of gas flow rate and deposition temperature. The codeposited coating is a complex of PB(Si)N containing essentially no free silicon. To increase the silicon content in the coating composition to above 7.0 wt. % and up to 35.0 wt. % the deposition temperature must lie in a narrow temperature range between 1300–1500° C. and the ammonia flow rate should be higher than the flow rate of boron and silicon and should preferably be twice the combined flow rate of the boron and silicon compounds.

Although the source gas for boron and silicon is not critical the preferred source gases are boron trichloride and trichlorosilane with ammonia as the source of nitrogen. Less desirable boron sources include boron trifluoride or diborane. Less desirable sources of silicon include dichlorosilane and silicon tetrachloride. Hydrazine may be used as the nitrogen source. The flow rate of the gases is critical and most preferably the source gases should be in the ratio $N/(B+Si) \geq 2$ where N is the nitrogen source, B the source gas for boron and Si the source gas for silicon.. Diluent gases such as hydrogen ($H_2$), nitrogen ($N_2$), or argon (Ar), may also be used.

Coatings produced by the present invention contain silicon tied to the boron and nitride in a compositional relationship $BSi_xN_{1+1.33x}$, with essentially no free silicon present in the coating. The content of silicon may vary between 2.0 wt. % Si and 42.0 wt. % Si with a preferred range of between 7.0 wt. % and 35.0 wt. %. With a coating silicon content of 7.0 wt. % the rate of oxidative weight loss of the coating at 1500° C. is one-tenth that of a pure PBN coating. A silicon content of above 35.0 wt. % tends to be markedly more brittle than those having lower silicon contents.

Although any deposition temperature in the critical temperature range of from 1350° C. to about 1550° C. will yield a PB(Si)N coating with low thermal expansion deposition temperatures in the range of 1450° C. to 1550° C. are preferred because such coatings show less shrinkage after long exposure at elevated temperatures. Coatings made in the 1350° C. to 1550° C. temperature range exhibit lower thermal expansion to 1500° C. than would be expected from their silicon contents, as illustrated in FIG. 2. Deposition temperatures above 1550° C. yield PB(Si)N with unacceptably high thermal expansion. For example, a PB(Si)N coating made at 1650° C. containing 6.0 wt. % silicon expanded by about 0.5% to 1500° C., about the same as pure silicon nitride.

X-ray diffraction shows that PB(Si)N coatings made at 1350° C. to 1550° C. are amorphous and glassy, so that the boron and silicon are intimately mixed. Coatings made at 1350° C. to 1450° C. can be heated in nitrogen (in situ) at 1500° C. to 1650° C. Such treatment can reduce the coating's oxidation rate and its shrinkage on prolonged high temperature exposure. Thermal treatment temperature can be higher than the original deposition temperature, since the strain at room temperature is determined by the deposition temperature.

Any carbon or graphite substrate which experiences thermal expansions from about 0.18% to 0.35% and a total expansion of 0.18% to 0.45% when heated to 1500° C. can receive a PB(Si)N coating which is free of cracks. The differential expansion between the coating and substrate will be less than 0.1% when the thermal expansion of the coating is between 0.28% and 0.45%, or less for a carbon-carbon material which expands 0.18%. The thermal expansion of the coating is 0.25% or more for a carbon-carbon which expands 0.35% to 1500° C. The ultimate strain limit of the PB(Si)N coatings is about 0.1%. Thus the PB(Si)B coatings are especially suitable for use with low-expansion, high-modulus carbon-carbon composites. A conventional carbon-carbon composite is composed of a woven or non-woven fabric of carbon fibers with a carbonaceous material directly bonded to the carbon fibers to form a unitary structure. An example of a carbon-carbon composite is a woven fabric of carbon fibers obtained by carbonizing polyacrylonitrile (PAN) fibers, forming a shaped substrate from the carbon fibers and depositing a pyrolytic material such as pyrolytic carbon on the carbon fibers. The deposition of pyrolytic carbon is typically carried out by introducing a hydrocarbon gas into the furnace containing the carbon fiber substrate under conditions permitting the gas to decompose and carbonize at the surface of the carbon fibers.

Carbon-carbon or graphite substrates can be mounted within the deposition chamber by support methods well known in the art. For example, thin strips can be supported in V-shaped slots; plates can be supported on rods or slats; and the substrates may be suspended from screws or supported on the ends of sharpened rods. In all of these methods, the support point may remain uncoated unless deposition is interrupted and the substrates are repositioned. Example 8 describes a rotating and tumbling support system which continually moves the support points and results in a uniformly coated, pinhole-free coating. This support system is preferred for coatings which must be continuous over the entire surface. The following Tables I and II were compiled from 10 operating Examples to illustrate the present invention with each of the 10 Examples described thereafter in detail:

TABLE I

Preparation Conditions and Properties of PB(Si)N Coatings on Carbon-Carbon Composites

| Ex. | Run Number | Deposition Conditions | | | | | | | Average Thickness | Density | Wt. % Silicon | Calculated Composition | Volume % | Percent Expansion to |
| | | Temp °C. | Pressure Torr | Time Minutes | Gas Flow Rates (lpm) | | | | mm | g/cc | | $BSi_xN_{1+1.33x}$ | $Si_3N_4$ | 1500° C. |
| | | | | | $BCl_3$ | $SiHCl_3$ | $NH_3$ | $H_2$ | | | | | | |
| 1 | 8927 | 1350 | 1.5 | 360 | 0.47 | 0.03 | 1.49 | 5.38 | 0.73 | 1.95 | 2 | $BSi_{0.02}N_{1.02}$ | 2.2 | 0.20[1] |
| 2 | 8933 | 1450 | 1.2 | 180 | 0.43 | 0.15 | 1.66 | 5.79 | 0.30 | 1.80 | 16 | $BSi_{0.19}N_{1.26}$ | 19.3 | 0.28 |
| 3 | 8935 | 1400 | 1.1 | 180 | 0.51 | 0.42 | 1.83 | 5.30 | 0.31 | 1.92 | 26 | $BSi_{0.40}N_{1.54}$ | 33.5 | 0.28 |
| 4 | 9001 | 1400 | 1.0 | 240 | 0.34 | 0.36 | 1.37 | 5.96 | 0.33 | 1.90 | 28 | $BSi_{0.46}N_{1.62}$ | 36.5 | 0.28 |
| 5 | 9004 | 1500 | 1.0 | 240 | 0.45 | 0.50 | 1.86 | 6.33 | 0.62 | 1.88 | 35 | $BSi_{0.74}N_{1.99}$ | 47.9 | 0.29 |
| 6 | A132 | 1400 | 0.48 | 1440 | 0.90 | 0.60 | 2.50 | 13.50 | 0.35 | 1.90 | 18 | $BSi_{0.23}N_{1.30}$ | 22.0 | 0.31[1] |

TABLE I-continued

Preparation Conditions and Properties of PB(Si)N Coatings on Carbon-Carbon Composites

| Ex. | Run Number | Temp °C. | Pressure Torr | Time Minutes | $BCl_3$ | $SiHCl_3$ | $NH_3$ | $H_2$ | Average Thickness mm | Density g/cc | Wt. % Silicon | Calculated Composition $BSi_xN_{1+1.33x}$ | Volume % $Si_3N_4$ | Percent Expansion to 1500° C. |
|---|---|---|---|---|---|---|---|---|---|---|---|---|---|---|
| 7 | A150 | 1450 | 0.78 | 720 | 0.90 | 0.60 | 2.50 | 13.50 | 0.24 | | | No Data - Reported in Run A153 | | |
|   | A153 | 1450 | 0.80 | 720 | 0.90 | 0.60 | 2.50 | 13.50 | 0.17 | 1.90 | 20 | $BSi_{0.26}N_{1.35}$ | 24.8 | |
| 8 | 9138 | 1525 | 1.2 | 480 | 0.42 | 0.40 | 1.24 | 5.09 | 0.21 | 1.90 | 25 | $BSi_{0.38}N_{1.50}$ | 32.0 | 0.29 |
| 9 | 9140 | 1575 | 1.3 | 300 | 0.45 | 0.40 | 1.39 | 5.56 | 0.38 | 1.95 | 24 | $BSi_{0.35}N_{1.47}$ | 30.5 | 0.26 |
| 10 | 9412 | 1400 | 0.52 | 450 | 0.39 | 0.35 | 1.51 | 0 | 0.45 | 1.83 | 36 | $BSi_{0.79}N_{2.06}$ | 49.6 | 0.32 |

NOTES:
Examples 1–5 and 8–9 were done in Pilot Plant CVD Furnace
Examples 6 and 7 were done in Factory CVD Furnace
Thermal expansion reduced to 0.25 after 2 hours heattreatment at 1475° C.

It is clear from the data presented above in Table I that the PB(Si)N coating of the subject invention has a substantially constant density which varies from 1.8 to 1.95 g/cc, approximating a density of 1.9 g/cc ±5% throughout a silicon range extending from about 2.0 wt. % to 35.0 wt. %. The substantially constant density is apparently the result of the inverse relationship between macrovoid volume and mole percent $Si_3N_4$, as reflected in FIG. 3. It is postulated that the macrovoid volume in the coating of the subject invention varies with mole percent in a way which enables the density and, in turn, thermal expansion to be constant. The PB(Si)N coating of the subject invention possesses a thermal expansion differential with respect to the substrate of less than about 0.1% to 1500° C. and, as a result, the coating is crack free.

The PB(Si)N coating of the subject invention possesses a thermal expansion differential with respect to the substrate of less than about 0.1 percent to 1500° C.

TABLE II

Oxidation Rates of Pure PBN and PB(Si)N

| 1200° C. | | 1510° C. | |
|---|---|---|---|
| Wt % Silicon | Weight Loss mg/cm²/hr | Wt % Silicon | Weight Loss mg/cm²/hr |
| 0 | 3.000 | 0 | 36.00 |
| 5 | 0.140 | 2 | 6.00 |
| 16 | 0.070 | 15 | 2.00 |
| 23 | 0.050 | 18 | 0.40 |
|   |   | 18* | 0.20 |
| 42 | 0.003 | 26 | 0.03 |

*After one hour of heat treatment in nitrogen at 1500° C.

EXAMPLE 1

(Run 8927)

Two high-modulus C—C composites, each approximately 70×25×2 mm in dimensions, were suspended inside the hot zone of a pilot plant CVD furnace (6.5 inches diameter by 12 inches long) using support rods placed through small holes drilled through the composites near one end. This system was placed inside a stainless steel vacuum chamber which was evacuated, and then the chamber was heated to 1300° C. Ammonia, $BCl_3$, $SiHCl_3$, and $H_2$ were fed into the deposition chamber at the flow rates listed in Line 1 of Table I to start the growth of Si-doped PBN. The ratio of $SiHCl_3$ to $BCl_3$ was 0.06. The reaction was carried out for 360 minutes at 1.5 Torr pressure. After the furnace had cooled, the coated C—C composites were removed, weighed, and the average coating thickness was estimated from surface area and density measurements. The coatings were observed to be crack-free and glassy, that is, no crystalline peaks. One of the coated composites was heated to 1500° C. for two hours, and a portion of the coating was removed. The coating had a density of 1.95 g/cc and a thermal expansion of only 0.20% to 1500° C. (Table I). This low thermal expansion implies less than 0.1% strain on the C—C composite and helps explain why the coatings were crack-free. The coating was analyzed by x-ray fluorescence and found to contain 2.0 wt. % silicon. This relatively small concentration of silicon was sufficient to impart increased oxidation resistance in the coating compared with a pure PBN coating, as can be seen in Table II, which compares the oxidation resistance of PBN and PB(Si)N coatings at 1200° C. and 1510° C.

EXAMPLE 2

(Run 8933)

Two high-modulus C—C composite bars similar to those of Example 1 were mounted in the deposition chamber, as described in Example 1, and the silicon-containing PBN coating was prepared at 1450° C. and 1.2 Torr pressure, using a higher $SiHCl_3/BCl_3$ ratio (0.34) than in Example 1 (see Line 2 of Table I. This condition yielded crack-free PBN coatings containing 16.0 wt. % silicon. Table II shows that the oxidation rate of a coating containing 15.0 wt. % silicon was substantially lower than that of the coating containing 2.0 wt. % silicon.

EXAMPLE 3

(Run 8935)

Two high-modulus C—C composite bars, similar to those of Example 1, were mounted in the deposition chamber, as described in the previous examples, and the silicon-containing PBN was prepared at 1400° C. and 1.1 Torr pressure using a $SiHCl_3/BCl_3$ ratio of 0.82. These conditions yielded crack-free coatings containing 26.0 wt. % Si. A portion of this sample exhibited a thermal expansion of 0.28% on heating from room temperature to 1500° C. (see FIG. 2), which means that the room-temperature thermal mismatch or strain between the coating and the composite is still only about 0.1% in spite of the high silicon concentration. Table II shows that the oxidation resistance of this coating at 1510° C. is three orders of magnitude better than that of pure PBN.

EXAMPLE 4

(Run 9001)

Two high modulus C—C composite bars, similar to those of Example 1, were mounted in the deposition chamber, as described in the previous examples, and the silicon-containing PBN coating was prepared at 1400° C. and 1.00 Torr pressure using a $SiHCl_3/BCl_3$ ratio of 1.05. The resulting coating was nearly crack-free in spite of the high silicon content of 28.0 wt. %. Its expansion to 1500° C. was the same as that of the sample from Example 3 (0.28%).

EXAMPLE 5

(Run 9004)

One high-modulus C—C composite bar and one conventional graphite bar were mounted in the deposition chamber, as described in Example 1, and the silicon-containing PBN was prepared at 1500° C. and 0.95 Torr pressure using a $SiHCl_3/BCl_3$ ratio of 1.11. The resulting coating contained 35.0 wt. % Si and was cracked. An uncracked part of the coating was heated and yielded a 0.29% expansion to 1500° C. The results, with this example and the earlier examples, indicates that the upper limit of silicon for crack-free PBN coatings on high-modulus C—C composites is on the order of 25.0 wt. % to 30.0 wt. % silicon. Since the thermal expansion did not increase significantly when going from 25.0 wt. % to 35.0 wt. % silicon, the cracks may be due to the high modulus of silicon nitride (350 GPa), compared with PBN (22 GPa), if the silicon is present as silicon nitride.

The success in obtaining crack-free, high-silicon-containing PBN coatings on high modulus C—C composites can be understood by reference to FIG. 2, which is a plot of the coating thermal expansion against weight percent silicon in the coating. (The data for this plot are from Table I.) Inhouse data for the thermal expansion of pure PBN (zero weight percent silicon) and pure CVD silicon nitride (60% silicon) are also shown in FIG. 2. Since the PB(Si)N coatings are most likely to be mixtures of BN and $Si_3N_4$, the volume percent of $Si_3N_4$ silicon can be calculated when the weight percent silicon is known, and plotted against percent thermal expansion, as shown in FIG. 3. It is seen that the thermal expansion of the PB(Si)N is lower than that which might be expected based on linear compositional effects and quite close to the values measured on PBN made at 1400° C., even for compositions containing almost 50 volume % $Si_3N_4$. The low thermal expansion of the PB(Si)N combinations is an unexpected result of our investigations on this type of coating.

EXAMPLE 6

(Run A132)

A factory-sized deposition chamber was used to coat carbon-carbon composite plates up to 150×320×2–3 mm thick. These plates were coated at 1400° C. and 0.48 Torr pressure using the gas flow rates and coating conditions listed in Line 6 of Table I. The $SiCHl_3$ to $BCl_3$ ratio was 0.67. The PBN coatings were 0.3–0.4 mm thick and contained 17–19 wt. % silicon. The average thermal expansion to 1500° C. was 0.28%. Table II shows that the oxidation resistance of this coating was between that of the coating which contained 15.0 wt. % silicon and the coating which contained 26.0 wt. % silicon.

EXAMPLE 6a

A portion of the coating from Run A132 was heated to 1500° C. for one hour in nitrogen before testing for oxidation resistance. Results in Table II show improved oxidation resistance as a result of this additional thermal procedure.

EXAMPLE 7

(Runs A150 and A153)

The factory-sized deposition chamber was used to coat C—C composite plates up to 140×460×3–4 mm thick together with C—C composite test coupons 30×80×3 mm. Gas flow rates and other conditions for this example are given in Table I. Some of the test coupons which had been coated in Run A150 were turned over and re-coated in Run A153 to cover the uncoated areas located at support points in Run A150. The combined thickness of the two coatings was about 0.4 mm. The doubly coated C—C composites were cycled to 2600° F. (1427° C.) to determine how well the coating protected the C—C composite. The weight loss of the C—C composite was about 1% after 80 cycles to 1427° C. in air, and about 2% after 100 cycles. This result shows that PB(Si)N coatings made by the present method are free of cracks and pinholes, resist repeated thermal shocks, and interpose an effective barrier between carbon and the atmosphere.

EXAMPLE 8

(Run 9138)

Carbon-carbon composite samples were coated over their entire surface in a single deposition run by using a system devised for rotating and tumbling the substrates. This system was rotated about a horizontal axis and the substrates were supported between slotted graphite plates which were attached to the graphite drive shaft at 60 degrees to the axis of rotation. As the system rotates, the points of contact between the C—C composite and its graphite holder vary continuously. In Run 9138, the system was rotated at 12 RPM. The coating was made at 1525° C. and 1.2 Torr pressure for 480 minutes. Other details are given in Line 9 of Table I. The $SiHCl_3/BCl_3$ ratio was 0.95 and the coating contained 25.0 wt. % silicon. Two out of three coatings from this run appeared to be crack-free.

EXAMPLE 9

(Run 9140)

A coating of PB(Si)N was prepared on a graphite substrate in which the thermal expansion to 1300° C. is about 0.7% to test compatibility with a coating of much lower thermal expansion. The coating was made at 1575° C. and 1.3 Torr pressure for 300 minutes. Other details are given in Line 10 of Table I. The $SiHCl_3/BCl_3$ ratio was 0.9 and the coating contained 24.0 wt. % silicon. Cracks were observed in the coating near sharp edges. A crack-free sample of the coating showed a 0.26% expansion to 1500° C. This indicates that the coating was under 0.4% compressive strain after cooling from deposition temperature. The result shows that low thermal expansion PB(Si)N can be made at temperatures as high as 1575° C., but for a given thermal expansion, it is better to make the coatings at below 1550° C. to decrease the difference between coating temperature and room temperature, and thereby reduce the strain in the coating at room temperature.

EXAMPLE 10

(Run 9412)

A coating of PB(Si)N was prepared on a regular graphite substrate (0.7% expansion to 1500° C.) and on a pyrolytic graphite substrate (0.25% expansion to 1500° C.) to determine whether hydrogen dilution was necessary to achieve PB(Si)N coatings with low thermal expansion. The coating was made at 1400° C., 0.11 Torr pressure, for 453 minutes with a $SiHCl_3/BCl_3$ ratio of 0.80 (see Line 11 of Table I). No hydrogen was added with the reacting gases. The PB(Si)N coating contained 36.0 wt. % silicon and showed 0.32% expansion to 1500° C., similar to that obtained with samples prepared with hydrogen dilution. This result shows that hydrogen is not needed to make PB(Si)N coatings with low thermal expansion, although the hydrogen or other gas may help in distributing the coating more uniformly over large surfaces.

What we claim is:

1. A coated article having a substrate selected from the group consisting of carbon, graphite and ceramic material upon which a coating is formed in direct intimate contact with said substrate, said coating having an amorphous and glassy composition consisting essentially of PB(Si)N containing from 7 wt. % to 35 wt. % silicon and essentially no free silicon, a substantially constant density of 1.9 q/cc±5% over said silicon range and a differential thermal expansion to 1500° C. of less than about 0.1% relative to the thermal expansion of said substrate such that said coating remains crack free at an elevated temperature between room temperature and 1500° C., said coating being formed by a process of introducing reactant vapors into a heated furnace chamber at a uniform deposition temperature of between 1350° C. to 1550° C. and at a chamber pressure of less than 1.5 Torr with said reactant vapors consisting essentially of ammonia, a gaseous source of boron and silicon and a diluent selected from the group consisting of nitrogen, hydrogen and combinations thereof, and controlling the flow rate of the gases such that the combined flow rates of boron and silicon is less than the flow rate of ammonia so as to inhibit the deposition of free silicon.

2. An article as defined in claim 1 wherein the flow rate of the gases are in a ratio of $N/(B+Si) \geq 2$ where N is the source of nitrogen, B the source of boron and Si the source of silicon.

3. An article as defined in claim 2 wherein said source of boron is boron trichloride, said source of silicon is trichlorosilane and the source of nitrogen is ammonia.

4. An article as defined in claim 1 wherein said substantially constant density approximates a density of 1.9 g/cc±5.0 percent throughout a silicon range extending from about 2.0 wt. % to 35.0 wt. %.

* * * * *